United States Patent [19]

Kruchko

[11] Patent Number: 5,389,476
[45] Date of Patent: Feb. 14, 1995

[54] METHOD FOR PRODUCING LIFE-SIZED DECALS

[76] Inventor: Steven N. Kruchko, 3839 Central Ave., Western Springs, Ill. 60558

[21] Appl. No.: 73,772

[22] Filed: Jun. 8, 1993

[51] Int. Cl.⁶ .......................... B44C 1/16; G03F 9/00
[52] U.S. Cl. .............................. 430/22; 101/DIG. 36; 428/39; 428/40; 428/41; 358/540
[58] Field of Search ............... 430/22; 40/605, 124.1, 40/310, 316, 624, 554; 101/DIG. 36; 358/515, 528, 540, 524; 428/40, 41, 39, 43

[56] References Cited

U.S. PATENT DOCUMENTS

| | | | |
|---|---|---|---|
| 3,591,942 | 7/1971 | Swearingen | 40/624 |
| 3,909,329 | 9/1975 | Smolen | 101/DIG. 36 |
| 4,060,643 | 11/1977 | Blanks | 430/22 |
| 4,244,769 | 1/1981 | Tracy | 40/624 |
| 4,308,310 | 12/1981 | Arnold et al. | 428/195 |
| 4,544,590 | 10/1985 | Egan | 428/41 |
| 4,564,406 | 1/1986 | Binks | 428/39 |
| 4,572,855 | 2/1986 | Kalus et al. | 428/41 |
| 4,616,268 | 10/1986 | Shida | 358/528 |
| 4,661,189 | 4/1987 | Voy et al. | 428/41 |
| 4,775,886 | 10/1988 | Hirosawa | 358/528 |

FOREIGN PATENT DOCUMENTS 9203805  5/1992  Rep. of Korea .

OTHER PUBLICATIONS

Wilby et al. "The Development . . . Colour Scanner" Printing Technol. vol. 14, pp. 142–152 (Dec. 1970).
Latham "Some Pointers . . . Register Problems" Island Printer/American Lithographer vol. 149 pp. 72–74 (Sep. 1962).
Venell "Registration . . . Preregistration" pp. 92–95 (Jul. 1988).

Primary Examiner—Charles L. Bowers, Jr.
Assistant Examiner—Martin Angebranndt
Attorney, Agent, or Firm—McAndrews, Held & Malloy

[57] ABSTRACT

In accordance with on aspect of the present invention a method is provided for making life-sized decals of an original figure. A photographic image of the figure is processed to create a digitized image containing the color information and overall shape of the photographic image. The digitized image is developed into a film negative image which is substantially the same size as the original figure. Registration marks are added to the film negative image to form registration lines in proximity to proposed joints. The film negative image is divided into image sections which overlap along the registration lines. The image sections are printed onto a clear medium removably laminated to a backing sheet. The image sections can be removed from the backing sheet and overlapped along the registration lines to reconstruct the original figure in life-size proportions.

34 Claims, 4 Drawing Sheets

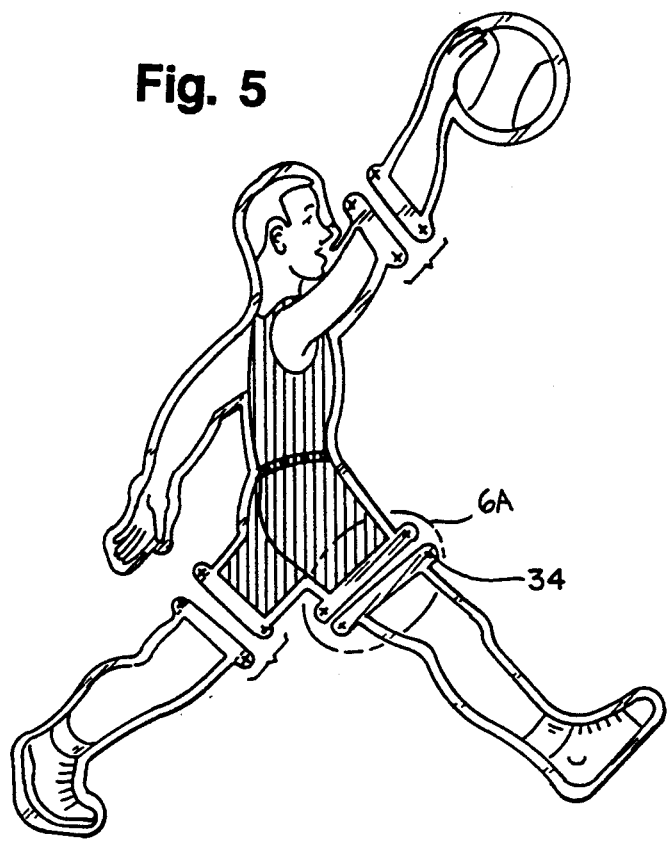
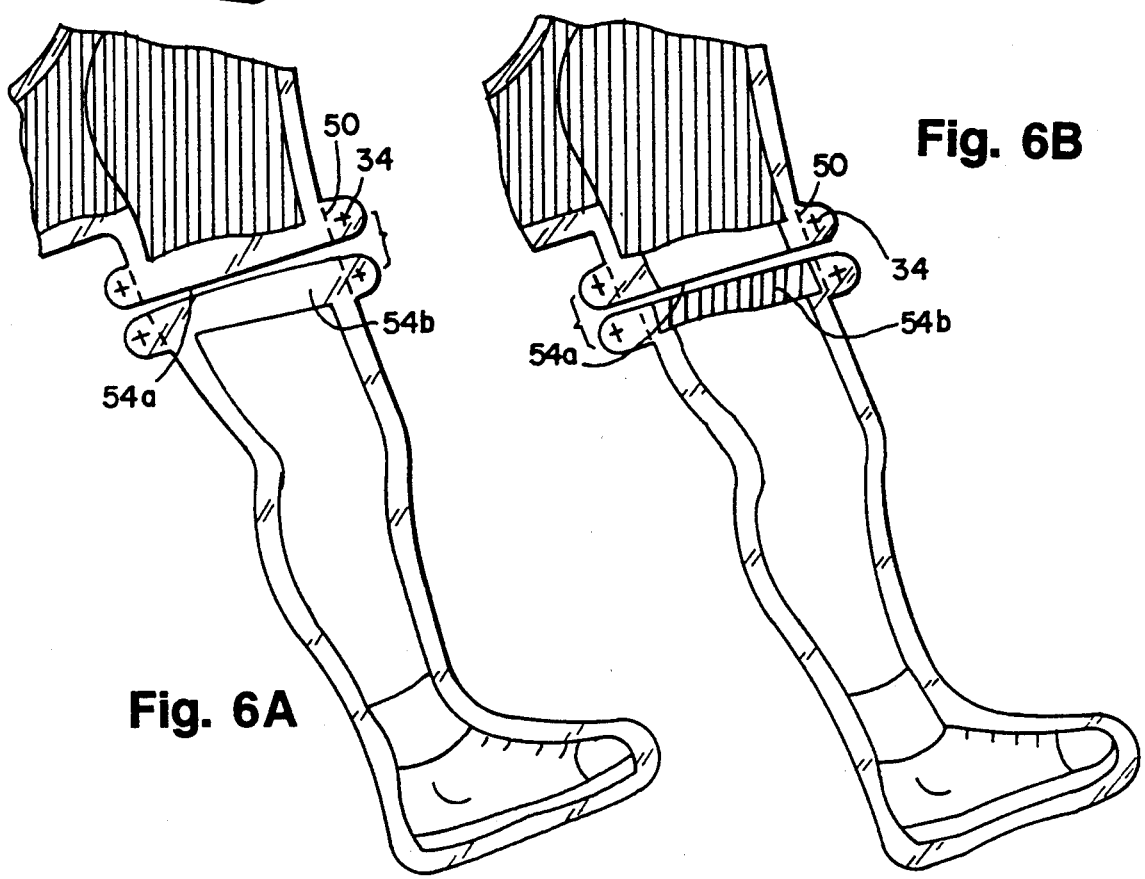

METHOD FOR PRODUCING LIFE-SIZED DECALS

FIELD OF THE INVENTION

This invention relates generally to printing and, more particularly, to a method for printing life-sized decals, decorations or the like.

BACKGROUND OF THE INVENTION

"Life-sized" reproductions of original figures are commonly used in advertising displays, such as point of sale displays. A number of conventional manufacturing processes are known for creating these "life-sized" reproductions. However, these conventional techniques are unsatisfactory because the finished product looks unrealistic and is often reduced in size. The simplest process involves enlarging a photograph of the original figure and printing the enlarged photograph on a sheet of paper or poster board. Figures produced using this process are not realistic because of the rectangular shape of the poster and background behind the figure. An alternative process involves mounting an enlarged photograph on a rigid substrate and then die cutting around the figure. This process produces an unrealistic looking figure because die cutting away the background inevitably causes unnatural edges and removes intricate details.

In a similar process the background is removed from behind the image prior to printing it on a substrate. The background can be removed from the photograph either electronically or manually. This process results in a white background when the figure is printed on paper. In order to create a more life like image, the white background is removed by die cutting. However, die cutting results in the same problems discussed above. If an attempt is made to maintain details of the figure, such as hair strands, the die cut area appears to have a white halo. Furthermore, areas of the poster that cannot be cost effectively die cut, such as the area behind spokes of a motorcycle wheel, will appear white. Leaving these areas white greatly reduces the impact and realism of the display.

An additional problem with these conventional processes is that the overall size of the figure is limited by the maximum size of the printing press. Currently, the largest commercially available offset printing presses only print a sheet which is 78"×56". In order to recreate fibres which are larger than 78"×56", the figure must either be reduced or printed in multiple pieces. Reducing the figure to fit the printing press causes the finished figure to look out of proportion. Alternatively, large figures can be printed on multiple sheets which are butted together to recreate the original figure. This process is acceptable in some applications, such as billboards, where the viewer is distant and accuracy is not critical. However, in situations where realism is critical, such as in point of sale displays, this process has many drawbacks. In particular it is commercially cost prohibitive to cut the printed sheets so that the two sheets line up exactly. Hence, the joints are typically located in dark inconspicuous areas. For example, a figure of a person standing might be butted together along the person's belt line. However, even if the joint is made in dark areas, the joint is visible in the finished product. In addition, the joint will vary in alignment because of the inexact manufacturing tolerances in the printing, mounting and die cutting processes.

Another major drawback is that due to the cost of die cutting and shipping complicated figures, point of sale displays produced using conventional processes are typically limited to simplistic shapes. Although using simple figures makes it easier to die cut the figure, it also greatly reduces the visual impact of the display. For example, in a display of a person holding a basketball, the person would most likely be photographed with his arms tucked along side his body and legs together so as to create a smooth-edged, simplistic figure which is easy to die cut. Photographing the same person leaping for a ball with his arms and legs extended apart, greatly increase the costs of die cutting the figure. Furthermore the finished figure is relatively expensive to package and delicate features are susceptible to damage during shipping and during display. As a result of these problems, the majority of figures displays do not have extended appendages or detailed edges.

A related process involves forming a decal by printing a drawing or painting on a clear medium which is removably laminated to a backing sheet. The printed decal can be removed from the backing sheet and reapplied to a wall or any other flat surface. Such a process is currently used by Priss Products, Inc. of Garland, Tex. to manufacture decals which serve as room decorations. A major disadvantage of this process is that it cannot be used to make decals if the original figure is larger than the maximum sheet size of commercially available printing presses. Rather, the decals must be reduced to fit within the maximum sheet size. An additional drawback is that the decals must be cut out by the end user.

OBJECTS AND ADVANTAGES

An object of the present invention is to provide a method for producing a printed decal which is substantially the same size as an original figure.

Another object of the present invention is to provide a method for producing a printed decal which can be larger than the maximum size of the printing press.

A further object of the present invention is to provide a method of producing a printed decal which is die cut and yet retains all of the detail of the original figure along the cut edges.

Still another object of the present invention is to provide a method of producing a printed decal which can be applied to a wall, removed from the wall, and reused.

Another object of the present invention is to provide a method for producing a printed decal which folds or rolls to a compact size for storage and shipping.

A further object of the present invention is to provide a simple and economical method for producing printed decals.

Other objects and advantages of the invention will become apparent upon reading the following detailed description and appended claims, and upon reference to the accompanying drawings.

SUMMARY OF THE INVENTION

In accordance with one aspect of the present invention a method is provided for making life-sized decals of an original figure. A photographic image of the original figure is processed to create a digitized image containing the color information and overall shape of the photographic image. The digitized image is developed into a film negative image which is substantially the same size as the original figure. Registration marks are added to the film negative image to form registration lines in proximity to proposed joints. The film negative image is divided into image sections which overlap along the registration lines. The image sections are printed onto a clear medium removably laminated to a backing sheet. The image sections can be removed from the backing sheet and overlapped along the registration lines to reconstruct the original figure in life-size proportions. The clear medium can be die cut along the outlines of the image sections to permit removal of the image sections from the backing sheet.

BRIEF DESCRIPTION OF THE DRAWINGS

For a more complete understanding of this invention reference should now be had to the embodiments illustrated in greater detail in the accompanying drawings and described below by way of example of the invention.

In the drawings:

FIG. 5 illustrates a reassembly of the image sections of FIG. 4A; and

FIGS. 6A-6B illustrate alternative embodiments of overlapping portions of the image sections.

DETAILED DESCRIPTION OF THE PREFERRED EMBODIMENTS

Figure 1:
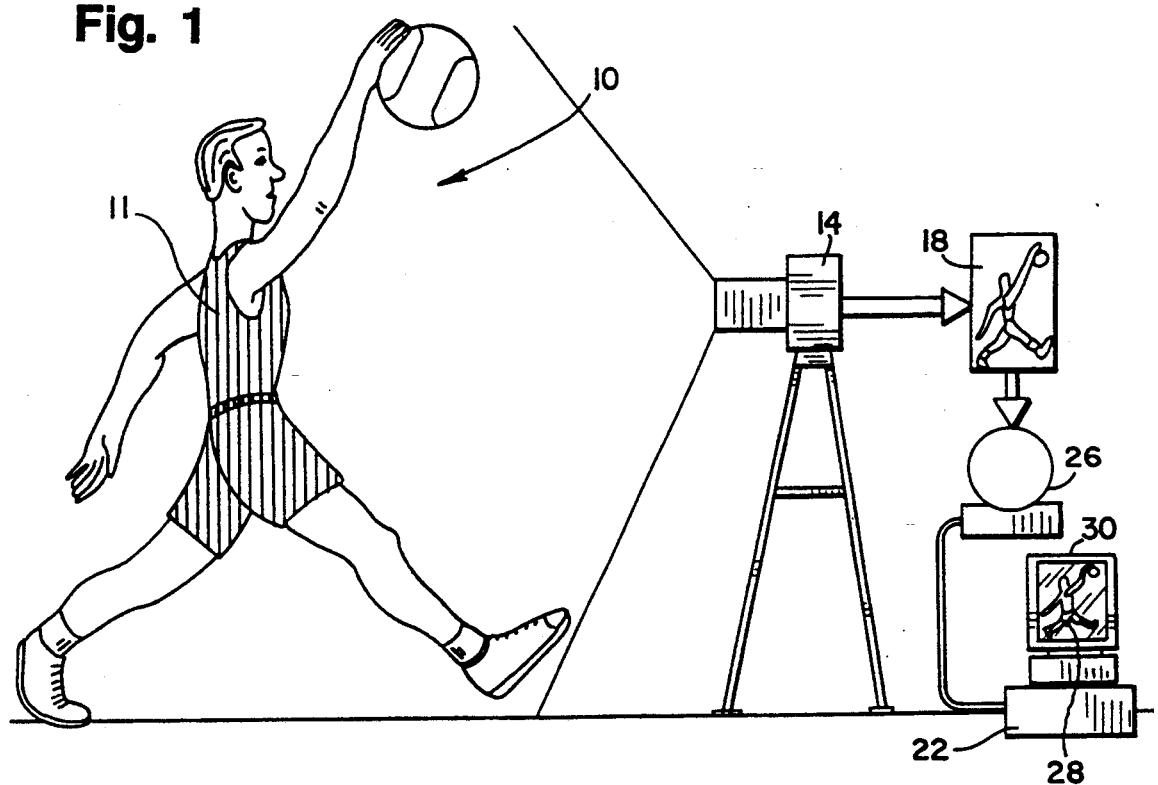
FIG. 1 is a schematic drawing illustrating certain steps of the present invention.

Referring initially to FIG. 1, the method for producing life-sized decals according to the present invention is explained. Decals produced in accordance with this method are well suited for use in point of sale advertisements and as wall decorations.

Initially, the original FIG. 10, illustrated as a basketball player 11, is photographed using high quality photographic equipment 14 and color film. It should be noted that although the present invention is described in connection with color reproductions, it is equally applicable to black and white reproductions. Preferably the original FIG. 10 is photographed using a professional quality camera which produces a master negative of at least 4"×5". Using a large master negative maintains the details of the original FIG. 10 during enlarging.

Next, the photographic image 18, i.e. the master negative or an image produced from the master negative, is scanned into a computer 22 using an image scanner 26 such as a drum scanner. The scanner 26 converts the photographic image into a digitized image 28 which is displayed on a computer screen 30. The digitized image 28 includes the color information and overall shape of the photographic image 18. This scanning process and the equipment used in connection with this process are well known in the printing industry and will not be explained in detail. A suitable scanner is a model Screen SG608 scanner as manufactured by Dainippon Screen Manufacturing of Kyoto, Japan and a suitable computer is a Scitex microassembler as manufactured by Scitex Corporation, Ltd of Herzlia, Israel.

Computer software, such as Scitex version 505, is used to manipulate the digitized image 28 and prepare it for printing. In particular, the digitized image 28 is enlarged until it is substantially the Same size as the original figure 10. During input from the scanner to the computer, the background values are manipulated to a color value of zero. Any colors remaining that are not part of the desired image are digitally masked to remove the background colors. The computer 22 can also be used to perform steps such as color correction, file dimming, tone compression, conversion of the measured additive primaries (red, green and blue) to the subtractive primaries (yellow, magenta and cyan) used in process color printing, detail enhancement, and color separation. Computerized image processing and image assembly of the type described above are well known in the printing industry and will not be explained in further detail.

Figure 2:
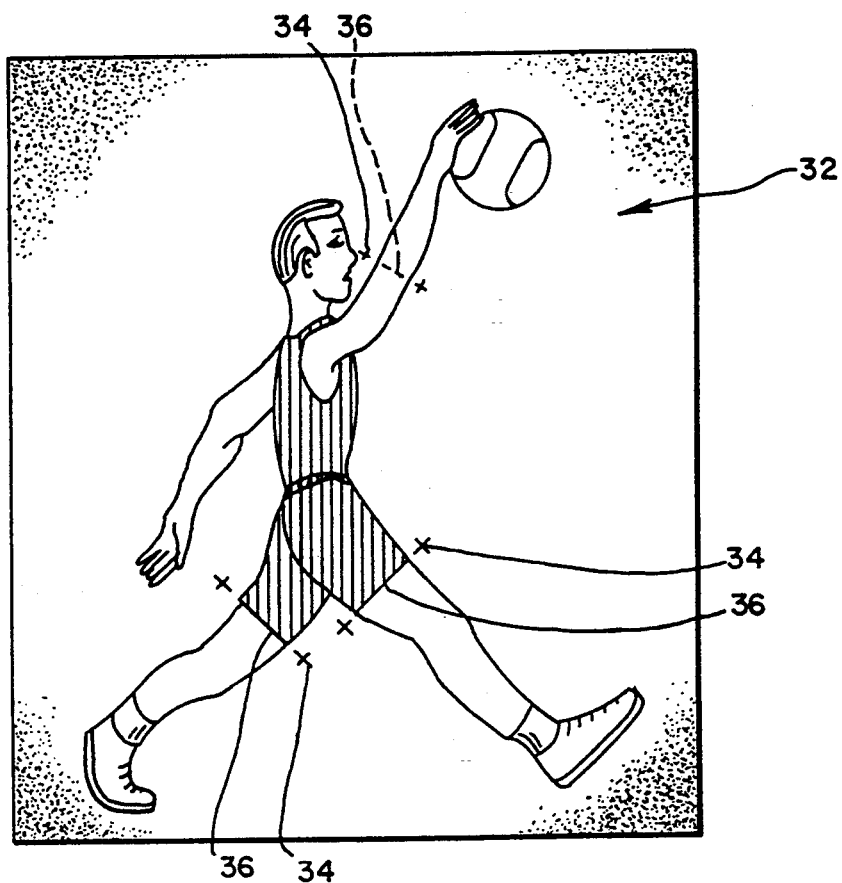
FIG. 2 is a film negative image produced according to the present invention.

Once the digitized image 28 is enlarged and processed as desired, it is developed, i.e. exposed, onto color separation films. This process results in four identical film negatives of the enlarged image—one film negative for each of the three subtractive primary colors and a one film negative for black. A film negative image 32 for the basketball player 11 is illustrated in FIG. 2. Depending on the size of the original FIG. 10, it may be possible to print the entire film negative image 32 on a single piece of color separated film, as is shown. However, large figures, such as automobiles, may have to be developed onto several sections of film and then assembled to form the film negative image 32.

Figure 3A:
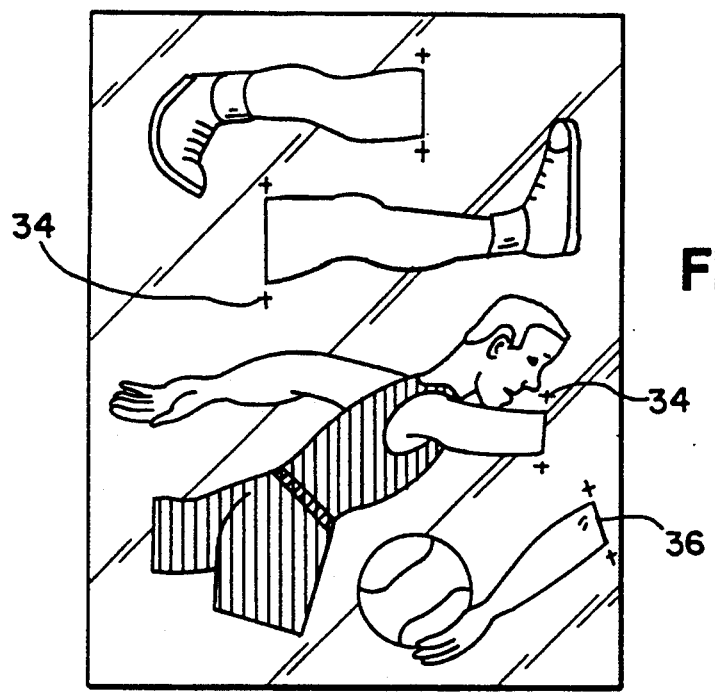
FIGS. 3A-3B illustrate alternative methods for dividing the film negative image of FIG. 2 into image sections in accordance with the present invention.
Figure 3B:
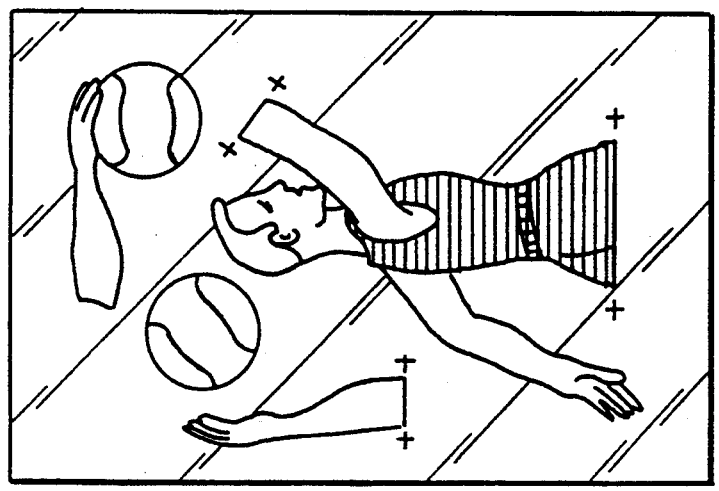
Figure 3B:
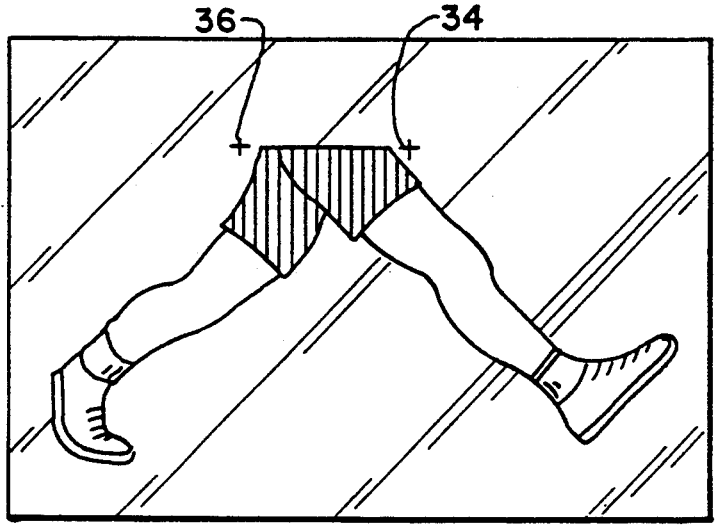

Using a light table, registration marks 34 are added to the film negative image 32 to form registration lines 36 in proximity to proposed joints. The film negative image 32 is then divided along the registration lines 36 to form image sections as illustrated in FIG. 3A. This step is performed by manually cutting the film negative image 32. The image sections are then arranged on a light table and spliced together so that the entire film negative image can be printed in a commercially available sheet feed offset printing press. As was mentioned above, the offset printing presses which are currently available print a maximum sheet size of 78"×56". Depending on the size of the original image, it may be possible to fit all of the image sections into an area which can be printed on a single sheet. Such an arrangement is illustrated in FIG. 3A. Alternatively, it may be necessary to arrange the image sections for printing on multiple sheets, as is illustrated in FIG. 3B. Dividing the image into image sections allows reproduction of life-size figures which are larger than the maximum size of the printing press.

The steps of adding the registration marks 34, sectioning the image, and arranging the images sections can all performed manually. Alternatively, any of these steps can also be performed in the computer 22, before the digitized image 28 is developed into the film negative image 32. Writing computer software to perform these image processing steps is a mere mechanical step for one skilled in the art of writing computer software.

After the image sections are arranged spliced together as desired, the image sections are transferred to printing plates using conventional plate making techniques. The resulting printing plates mirror the film negative shown in FIGS. 3A-3B. In addition to the traditional four color separated plates, a fifth plate is made which consists of a 100% opaque silhouette of the image. The printing plates are used in connection with a commercially available printing press, such as multicolor sheet feed offset printing press, to print the image. The image sections are printed by initially printing a substantially white silhouette of the image sections using the opaque printing plate and then in registration printing the additional colors necessary to reproduce the color characteristics of the original FIG. 10. Printing the white silhouette before printing the other colors ensures that areas which are white on the original FIG. 10, such as teeth, will be white on the printed image. This white silhouette also prevents the wall color from migrating through the printed image.

The image sections are printed onto sheets of a clear medium removably laminated to a backing sheet to form a decal. Suitable materials for the clear medium include commercially available materials such as clear polyester or vinyl. The clear medium is preferably laminated to the backing sheet by an adhesive which remains on the clear medium after it is removed from the backing sheet. A suitable adhesive is manufactured by Fasson Merchant Products Division of Painesville, Ohio. Alternatively, the clear medium can be statically laminated to the backing sheet.

Figure 4A:
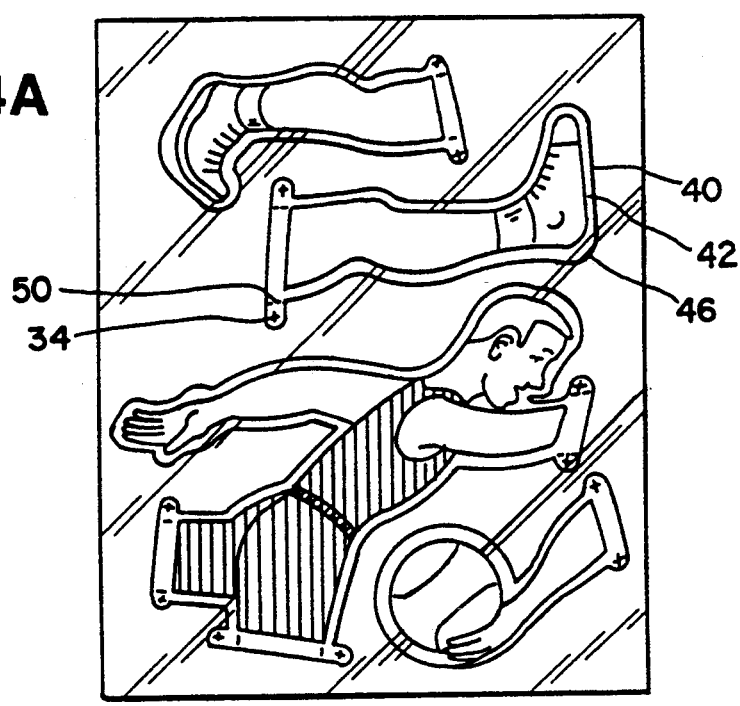
FIGS. 4A-4B illustrates the image sections of FIGS. 3A-3B after die cutting.
Figure 4B:
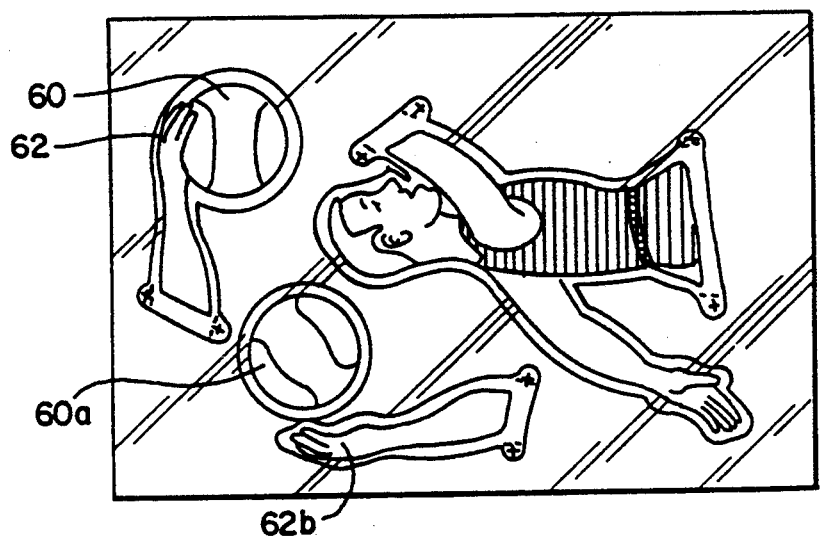
Figure 4B:
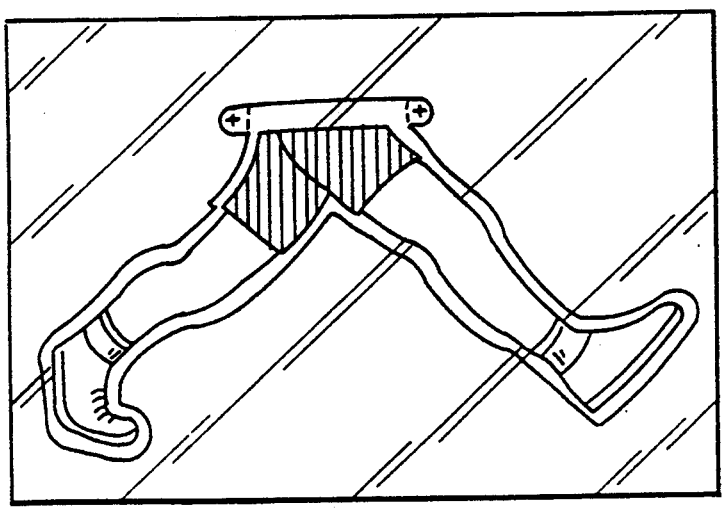

The printed decal sheets are then die cut to permit the image sections to be easily removed from the backing sheet. Although die cutting is preferred, it may be desirable to eliminate this step to reduce the cost of the finished product. FIGS. 4A–4B illustrate the printed sheets after the die cutting operation.

As can be seen, the die cut 40 generally tracks the outlines of the image sections. However, since the image sections are printed on a clear medium the die cut does not need to remove the background from the image as is necessary when conventional manufacturing techniques are employed. Rather, the die cut rule can be constructed to leave a border 42 of the clear medium around the image sections. The clear border 42 ensures that all of the details of the original FIG. 10 are retained along the cut edges. When the image sections are reassembled on a wall, the border 42 will be the same color as the wall and it will look like the original FIG. 10 is standing in front of the wall.

The depth of the die cutting rule is set so that only the clear medium is cut, while the backing sheet remains uncut. This results in a finished product that is easy and economical to package and ship. In addition, the die cut rule can be notched to leave portions of the clear medium uncut so as to form nicks 46. The die cut rule can also be constructed to make a perforated cut 50 around the registration marks 34. A perforated cut permits the registration marks 34 to be easily removed following reassembly of the image sections.

Die cutting completes the manufacturing process. The printed decal is then sold to end users who remove the image sections from the backing sheet and overlaps them in a registry on a wall or other surface so as to reconstruct a decal of the original FIG. 10 in life-size proportions. Reassembly of the decal from FIG. 4A is illustrated in FIGS. 5, 6A, and 6B. The printed registration marks 34 ensure that the image sections are accurately aligned to one another. Once the image sections are installed, the perforated cut 50 permits the registration marks 34 to be easily removed from the assembled decal.

As can be seen, the image sections are formed and die cut to form overlapping portions 54a, 54b. The overlapping portions 54a, 54b can be transparent as illustrated in FIG. 6A. Alternatively, the overlapping portions 54a, 54b can include identical portions of the image as illustrated in FIG. 6B. Using clear overlapping portions 54a, 54b as shown if FIG. 6A is preferred because it reduces the visibility of any misalignment which occurs when the image sections are installed by the end user.

A further advantage of the present invention is that the image can be sectioned so that the end user can vary the decal during assembly. An simple example of this process is illustrated in FIG. 4B. As can be seen, the decal of FIG. 4B can be assembled in one of two ways. First, the decal can be assembled so that the basketball 60 is touching the player's hand 62. In addition, the decal has been printed to include a second hand 62b and a second basketball 60b. These sections can be used to assemble a decal in which the basketball is not touching the player's hand. A printed decal such as is shown in FIG. 4B can be created by modifying the digitized image 28 in the computer or by combining several photographs into one digitized image. Alternatively, the process can be performed by manually cutting and sectioning the film negative image 32 on a light table.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A method for making life-sized decals of an original figure on a sheet fed printing press having a maximum sheet size which is smaller than the size of the original figure, comprising the steps of:

creating a photographic image of the original figure;

creating a digitized image which contains the color information and overall shape of the photographic image;

developing the digitized image into plural color separation film negative images which are substantially the same size as the original figure, one film negative for at least each of cyan, magenta, yellow and black;

adding registration marks to the color separation film negative images to form registration lines between proposed image sections;

dividing the color separation film negative images into image sections which are smaller than the maximum sheet size of the printer and which overlap along the registration lines;

transferring the image sections of the color separation film negative images onto printing plates; and printing the image sections onto sheet material comprising a clear medium removably laminated to a backing sheet, wherein the image sections printed on the clear medium can be removed from the backing sheet and overlapped in registry to reconstruct the original figure in proportions larger than the size of the sheet material.

2. The method of claim 1, further comprising the step of die cutting the clear medium along the outlines of the image sections to permit the image sections to be removed from the backing sheet and overlapped in a registry to reconstruct the original figure in proportions larger than the size of the original sheet material.

3. The method of claim 2, wherein the step of die cutting further comprises making a perforated cut in the clear medium around the registration marks to permit removal of the registration marks following reconstruction of the original figure.

4. The method of claim 1, wherein the clear medium is laminated to the backing sheet by an adhesive which remains on the clear medium after it is removed from the backing sheet.

5. The method of claim 1, wherein the clear medium is statically laminated to the backing sheet.

6. The method of claim 1, further comprising the step of digitally masking the digitized image to remove undesired background information.

7. The method of claim 1, wherein the image sections include overlapping portions which are transparent.

8. The method of claim 1, wherein the step of printing the image comprises the step of first printing a substantially white silhouette of the image sections on the clear medium and then in registration printing the additional colors necessary to reproduce the color characteristics of the original figure.

9. The method of claim 1, wherein the step of creating a digitized image comprises electronically scanning the photographic image into a computer.

10. The method of claim 1, wherein the step of developing the color separation film negative images comprises the steps of:
    electronically enlarging the digitized image until it is substantially the same size as the original figure;
    developing the enlarged digitized image onto multiple pieces of film; and
    assembling the multiple pieces of film to form the film negative image.

11. The method of claim 1, wherein the image is printed on multiple sheets of the clear medium.

12. The method of claim 1, further comprising the step of arranging the image sections so as to minimize the amount of clear medium required for printing.

13. The method of claim 1, wherein the clear medium is vinyl.

14. A method for making life-sized decals of an original figure on a sheet fed printing press having a maximum sheet size which is smaller than the size of the original figure, comprising the steps of:
    creating a digitized image which contains the color information and overall shape of the original image;
    developing the digitized image into plural color separation film negative images which are substantially the same size as the original figure, one film negative for at least each of cyan, magenta, yellow and black;
    dividing the color separation film negative images into image sections which are smaller than the maximum sheet size of the printer;
    transferring the image sections of the color separation film negative images onto printing plates;
    printing the image sections onto sheet material comprising a clear medium removably laminated to a backing sheet; and
    die cutting the clear medium along the outlines of the printed image sections to permit the image sections to be removed from the backing sheet and overlapped in a registry to reconstruct the original figure in proportions larger than the size of the sheet material, the die cut extending beyond the edge of the printed image by a preselected amount to provide a border of clear material around the printed image.

15. The method of claim 14, wherein the step of creating a digitized image further comprises the steps of:
    creating a photographic image of the original figure; and
    electronically scanning the photographic image to create a digitized image which contains the color information and overall shape of the photographic image.

16. The method of claim 15, wherein the step of developing the color separation film negative images further comprises the steps of:
    electronically enlarging the digitized image until it is substantially the same size as the original figure; and
    developing the enlarged digitized image into the color separation film negative images.

17. The method of claim 16, wherein the step of developing the color separation film negative images further comprises the steps of:
    developing the enlarged digitized image onto multiple pieces of film; and
    assembling the multiple pieces of film to form the color separation film negative images.

18. The method of claim 15, including the step of digitally masking the digitized image to remove undesired background information.

19. The method of claim 14, further comprising the step of adding registration marks to the color separation film negative images to form registration lines between proposed image sections.

20. The method of claim 19, wherein the step of die cutting further comprises making a perforated cut in the clear medium around the registration marks to permit removal of the registration marks following reconstruction of the original figure.

21. The method of claim 19, wherein the step of adding the registration marks to the color separation film negative images is performed after the color separation film negative images are developed.

22. The method of claim 19, wherein the step of adding the registration marks to the color separation film negative images is performed by electronically adding the registration marks to the digitized image before it is developed into the color separation film negative images.

23. The method of claim 14, wherein the clear medium is laminated to the backing sheet by an adhesive which remains on the clear medium after it is removed from the backing sheet.

24. The method of claim 14, wherein the clear medium is statically laminated to the backing sheet.

25. The method of claim 14, wherein the step of printing the image sections further comprises the steps of first printing a substantially white silhouette of the image sections on the clear medium and then in registration printing the additional colors necessary to reproduce the color characteristics of the original figure.

26. A method for making life-sized decals of an original figure on a sheet fed printing press having a maximum sheet size which is smaller than the original figure, comprising the steps of:
    creating a photographic image of the figure;
    electronically scanning the photographic image to create a digitized image which contains the color information and overall shape of the image;
    developing the digitized image into plural color separation film negative images, one film negative for at least each of cyan, magenta, yellow and black, which are substantially the same size as the original figure and includes marks forming registration lines between proposed image sections;

dividing the color separation film negative images into image sections which are smaller than the maximum sheet size of the printer transferring the image sections of the color separation film negative images onto printing plates; which overlap along the registration lines; and printing the image sections onto sheet material comprising a clear medium removably laminated to a backing sheet by first printing a substantially white outline of the image sections and then in registration printing the additional colors necessary to reproduce the color characteristics of the original figure; and die cutting the clear medium along the outlines of the image sections to permit the image sections to be removed from the backing sheet and overlapped in a registry to reconstruct the original figure in proportions larger than the size of the sheet material.

27. The method of claim 26, wherein the step of adding the registration marks to the color separation film negative images is performed after the color separation film negative images are developed.

28. The method of claim 26, wherein the step of adding the registration marks to the color separation film negative images is performed by electronically adding the registration marks to the digitized image before it is developed into the color separation film negative images.

29. The method of claim 26, wherein the step of die cutting further comprises making a perforated cut in the clear medium around the registration marks to permit removal of the registration marks following reconstruction of the original figure.

30. The method of claim 26, wherein the clear medium is laminated to the backing sheet by an adhesive which remains on the clear medium after it is removed from the backing sheet.

31. The method of claim 26, wherein the clear medium is statically laminated to the backing sheet.

32. The method of claim 26, further comprising the step of digitally masking the digitized image to remove undesired background information.

33. The method of claim 26, wherein the step of developing the color separation film negative images further comprises the steps of:

electronically enlarging the digitized image until it is substantially the same size as the original figure; and developing the enlarged digitized image into the color separation film negative images.

34. The method of claim 33, wherein the step of developing the color separation film negative images further comprises the steps of:

developing the enlarged digitized image onto multiple pieces of film; and assembling the multiple pieces of film to form the color separation film negative images.

* * * * *